United States Patent [19]

Roznitsky

[11] Patent Number: 5,903,150

[45] Date of Patent: May 11, 1999

[54] ANTENNA SYSTEM FOR NMR AND MRI APPARATUS

[76] Inventor: Samuel Roznitsky, 34-14 Linwood Rd., Fairlawn, N.J. 07410

[21] Appl. No.: 08/915,205

[22] Filed: Aug. 20, 1997

Related U.S. Application Data

[63] Continuation-in-part of application No. 08/782,592, Jan. 13, 1997, abandoned, which is a continuation-in-part of application No. 08/656,766, Jun. 3, 1996, abandoned.

[51] Int. Cl.⁶ .................................................. G01V 3/00
[52] U.S. Cl. ........................................ 324/318; 324/322
[58] Field of Search .................................. 324/318, 322, 324/314, 307, 309, 300

[56] References Cited

U.S. PATENT DOCUMENTS

| | | | |
|---|---|---|---|
| 4,901,022 | 2/1990 | Keren et al. | 324/322 |
| 4,926,126 | 5/1990 | Haragashira | 324/322 |
| 4,975,644 | 12/1990 | Fox | 324/318 |
| 5,003,265 | 3/1991 | Leussler | 324/318 |
| 5,050,605 | 9/1991 | Eydelman et al. | 324/318 |
| 5,144,244 | 9/1992 | Kess | 324/322 |
| 5,162,738 | 11/1992 | Sepponen | 324/318 |
| 5,166,617 | 11/1992 | Ni | 324/318 |
| 5,202,634 | 4/1993 | Potthast et al. | 324/322 |
| 5,206,639 | 4/1993 | Kamens | 340/825.54 |
| 5,216,367 | 6/1993 | Mori | 324/318 |
| 5,256,972 | 10/1993 | Keren et al. | 324/318 |
| 5,302,901 | 4/1994 | Snelten | 324/322 |
| 5,317,266 | 5/1994 | Meissner | 324/318 |
| 5,321,412 | 6/1994 | Kopp et al. | 343/724 |
| 5,329,233 | 7/1994 | Hayes | 324/318 |
| 5,453,692 | 9/1995 | Takahashi et al. | 324/318 |
| 5,473,252 | 12/1995 | Renz et al. | 324/318 |
| 5,489,847 | 2/1996 | Nabeshima et al. | 324/322 |
| 5,583,438 | 12/1996 | Eydelman et al. | 324/318 |
| 5,585,721 | 12/1996 | Datsikas | 324/322 |

*Primary Examiner*—Louis M. Arana
*Attorney, Agent, or Firm*—Frishauf, Holtz, Goodman, Langer & Chick

[57] ABSTRACT

An antenna system, for use in an NMR or MRI apparatus which includes a radio frequency (RF) signal transmitter and a radio frequency (RF) signal receiver, includes at least first and second electromagnetically coupled circuits, the first circuit comprising a first inductance producing a first electromagnetic field flux vector, and the second circuit comprising a second inductance producing a second electromagnetic field flux vector having a component which interacts with a component of the first electromagnetic field flux vector. A switch system has a first switching position for coupling the first circuit to an output of the RF signal transmitter and preventing a damaging level of signal from the second circuit from being fed to an input of said RF signal receiver, and a second switching position for permitting an RF signal from the second circuit to be fed to an input of the RF signal receiver and decoupling the first circuit from the output of the RF signal transmitter. The antenna produces an electromagnetic field flux enclosing an examination object therewithin, to irradiate the examination object, when the switch system is in the first switching position. An electromagnetic field flux produced by a signal emitted by the examination object's relaxing nuclei is picked up by the antenna system and is fed to the RF signal receiver via the second circuit, when the switch system is in the second switching position. An array antenna system capable of producing a useful variety of electromagnetic field shapes and coverages may be made up of a combination of antenna elements.

69 Claims, 7 Drawing Sheets

ANTENNA SYSTEM FOR NMR AND MRI APPARATUS

CROSS REFERENCE TO RELATED APPLICATION

This is a Continuation-in-Part of my prior application Ser. No. 08/782,592 filed Jan. 13, 1997 now abandoned, which in turn is a Continuation-in-Part of my earlier application Ser. No. 08/656,766 filed Jun. 3, 1996 now abandoned. The entire contents of both said prior applications Ser. Nos. 08/782,592 and 08/656,766 are incorporated herein by reference.

BACKGROUND OF THE INVENTION

1. Field of the invention

The present invention is directed to transmission and reception antennas for use in a nuclear magnetic resonance (NMR) apparatus and in a magnetic resonance imaging (MRI) apparatus, for calculating spectra or generating images of an examination subject or object.

2. Description of the Prior Art

Nuclear magnetic resonance (NMR) is the effect of a resonant rotating or alternating magnetic field, imposed at right angles to a static field, to perturb the orientation of nuclear magnetic moments.

Magnetic resonance imaging (MRI) is the development of nuclear magnetic resonance (NMR) techniques for obtaining a diagnostic scan of a subject such as a human or animal body.

The patient or examination subject is placed in a strong magnetic field. This magnetic field induces a net magnetization of the nuclei in the subject. A short radio frequency pulse (RF pulse) is applied at the Larmor frequency of the precessing nuclei which, in turn, emit an RF signal of the same frequency. This is detected and gives a "fingerprint" of the environment of the nucleus being studied. This information is one-dimensional but is converted into a two-dimensional anatomical image by adding a gradient to the applied magnetic field which results in a frequency modulation of the emitted RF signal. A series of such measurements is analyzed by computer to generate the image.

In an NMR apparatus, as well as in an MRI apparatus, a strong magnetic field aligns the nuclei of the subject or object to be studied along the field direction. A radio frequency field delivered through a transmitter antenna, also known as the transmitter coil, brings the nuclei to a higher energy state.

A receiver antenna, also referred to as a receiver coil, intercepts the signal emitted by the object (patient) as its nuclei precess or relax from the higher energy state.

The conditions of efficient energy absorption require that the RF fields of the transmitter and receiver antennas be orthogonal to the static magnetic field. The simultaneous condition of negligibly low interaction between the receiver and transmitter antennas for minimal mutual distortion of their RF fields and for the prevention of high transmitter power to be applied to the receiver, in part also means that the RF fields of the transmitter and receiver antennas must be orthogonal even though transmission and reception do not coincide in time. Acceptable switching time between the two is of the order of about ten microseconds.

As represented by FIG. 1, which shows the prior art, a radio frequency (RF) transmitter 4 transmits a signal to a transmitter antenna 2. The signal which is absorbed and subsequently reemitted by the examination body or subject (patient) 5 is then picked up by a receiver antenna 1 and fed to a radio frequency (RF) receiver 3. The examination body or subject 5 which is being scanned is within the RF fields of both the transmitter and receiver antennas 2,1. The transmitter antenna 2 and receiver antenna 1 are optimized for their respective tasks and are tuned by variable capacitors 6 and 7. Normally, the single, fixed in place transmitter antenna 2 is big enough to encompass the largest part of a body or subject 5 to be scanned. Significantly smaller reception antennas 1, specialized for different body parts, are separately connected and used. Magnet poles 8 and 9 are shown located above and below the patient (body or subject 5), respectively.

Because of the orthogonal arrangement and spatial separations of the transmitter antenna 2 and receiver antenna 1, the resulting low electromagnetic coupling between the transmitter antenna 2 and receiver antenna 1 assures low field distortion and allows utilization of speedy and efficient electronic tuning for the receiver antenna 1. The required transmitting power is high and manual tuning of the transmitter antenna 2 by a variable capacitor 6 is employed, for no known electronically controlled semiconductor device may withstand the incident power.

Another limitation of the prior art apparatus is that the magnet gap between magnet poles 8 and 9 should be large enough to receive the two separate antennas 1, 2 therebetween, which is not always possible or cost efficient.

These prior art types of devices are described, for example, in U.S. Pat. Nos. 4,926,126; 4,975,644; 5,144,244; and 5,256,972, the entire contents of which are incorporated herein by reference.

FIG. 2 represents another prior art apparatus using a single antenna 10 which is alternatively switched by switch 14 between the RF signal transmitter 12 and RF signal receiver 13. The antenna 10 is tuned by a variable capacitor 11.

In the case of FIG. 2, the transmitter power requirement is significantly lower as compared to the embodiment of FIG. 1. The antenna 10 is not limited to a single orientation but may be multi-orientable. The antenna 10 also does not put a large constraint on the size of the magnet gap. These prior art types of devices are described, for example, in U.S. Pat. Nos. 4,901,022 and 5,166,617, the entire contents of which are incorporated herein by reference. However, even though the transmitter power is lower in the embodiment of FIG. 2, the transmitter power requirement is still so high as to prevent simple implementation of electronic antenna tuning.

SUMMARY OF THE INVENTION

An object of the present invention is to provide a unique antenna circuitry for use in NMR and MRI apparatus wherein a single antenna utilizing a plurality of interacting inductance coils is positioned so as to enclose the object or subject to be scanned in its transmitting and receiving RF fields.

A further object is to provide an antenna which can be electronically tuned through a varactor (an electronically controlled variable capacitor), which needs only low transmitter power, which is small and is multi-orientable, and which has high sensitivity at reception.

A still further object is to provide an antenna which by employing a controlled combination of many antenna elements can produce a useful variety of fields of desired shape and coverage.

According to the invention, an antenna system comprises at least two electromagnetically coupled circuits. The inductance coil in each circuit is comprised of a coil producing an RF (radio frequency) field fully or partially enclosing the examination object or subject. The combined RF field, which is a result of interaction between the electromagnetically coupled circuits, excites the nuclei of the full volume of interest and subsequently intercepts the signal emitted by those nuclei as they relax from their higher energy state.

As proximately positioned coils normally have a low level of electromagnetic coupling, this low level of interaction leads to a frequency response curve of the combined circuit which approximates a multiplication of separate frequency response curves for each circuit. This, in turn, contributes to higher selectivity and sensitivity of the antenna at reception, as compared to a single circuit.

One of the circuits is connected to a transmitter through a first switch device which, in its closed position, forwards the transmitter power to the antenna during the transmitting RF pulse. A second circuit is connected to the receiver. This second circuit may incorporate a tuning varactor and a second switch device. The second switch device effectively shorts, during transmission, the part of the circuit which includes the varactor and the receiver input, thus decoupling them and protecting them from the excessive power during transmission. The combined frequency of the antenna during transmission is controlled by a variable capacitor in the first circuit.

At the time of reception, all switch devices are open, causing the transmitter to be effectively disconnected from the antenna, while the receiver input is freed to pick up a signal, and the varactor is used to control the antenna's resonant frequency.

Since the antenna is located in the very proximity to the examination object, transmitting power requirements are minimal. By using an ohmic resistance on the transmitter side of the first switch device, antenna bandwidth at transmission can be artificially widened, making the antenna substantially indifferent to load variations at the expense of somewhat higher transmitter power requirements. Thus, the reception bandwidth is not influenced and retains its prior high selectivity properties.

The first and second switch devices are easily implemented by using a pair of oppositely interconnected diodes for each connectivity link. Application of transmitter power causes the diodes to conduct, effectively shorting them (i.e., effectively closing the switch) and allowing the power to proceed or pass through. Removal of transmitter power brings the diodes back into a high impedance nonconductive state (i.e., switch open).

The antenna can be positioned at a multitude of orientations in a NMR or MRI apparatus as long as its electrical axis remains perpendicular to the static magnetic field. This property makes it particularly suitable for kinematic orthopaedic examinations.

The antenna system of the present invention is fail-safe. Nonpermissible and unintended high levels of RF power are avoided by the inherent features of low required power and by automatic detuning of the antenna in a case of a single or plural components failure.

Those skilled in the art will understand that the principles presented herein allow antenna implementation in a multitude of ways which depend on particular application specific requirements: such as Larmor frequency, examination subject or object, magnet field orientation. It will also be clear that a multitude of components can be used instead of those described, for example: any type of variable capacitor can be used in place of a varactor, a set of capacitors can be used in place of any single capacitor, (the same with respect to the varactor), and an electronically controlled switch or RF isolator can be used in place of a pair of oppositely interconnected diodes.

DETAILED DESCRIPTION OF THE DRAWINGS

Figure 1:
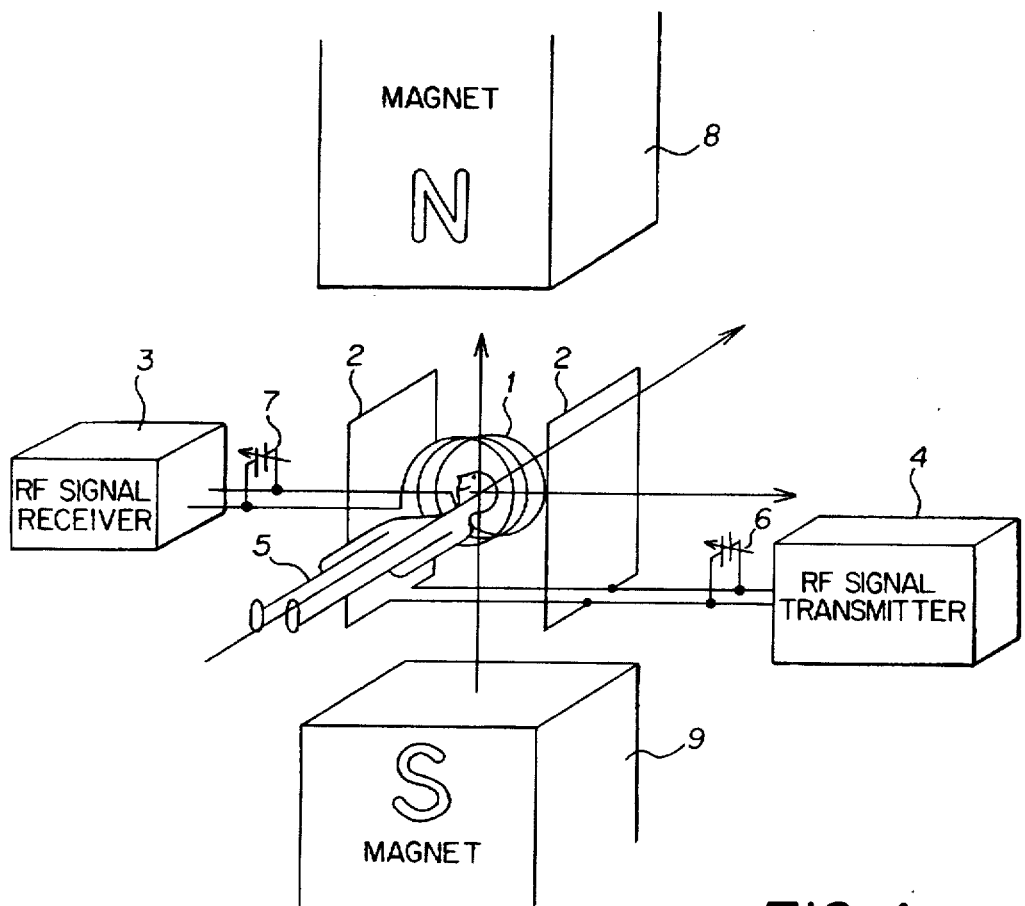
FIG. 1 is a schematic representation of a conventional nuclear magnetic resonance (NMR) or magnetic resonance imaging (MRI) apparatus of a type comprising separate transmission and reception antenna systems.
Figure 2:
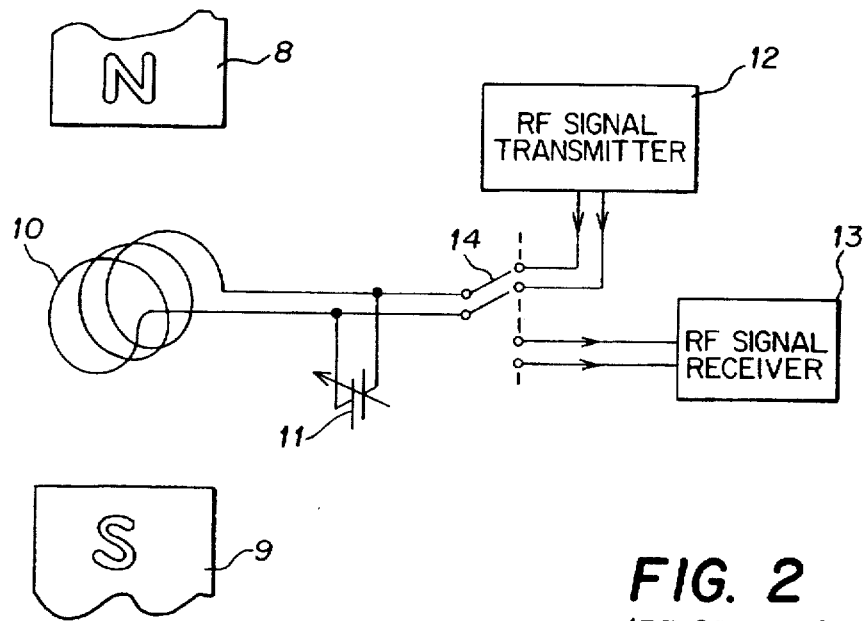
FIG. 2 is a schematic representation of a conventional NMR or MRI apparatus having one antenna system.
Figure 3:
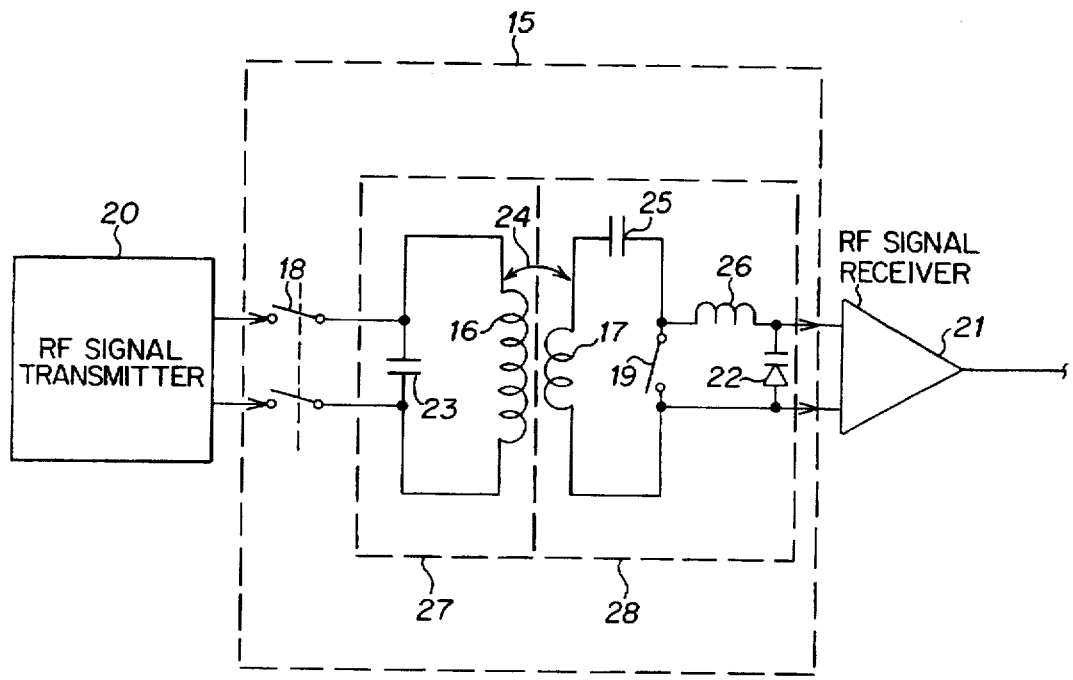
FIG. 3 is an electrical schematic of the antenna system of the present invention.
Figure 4:
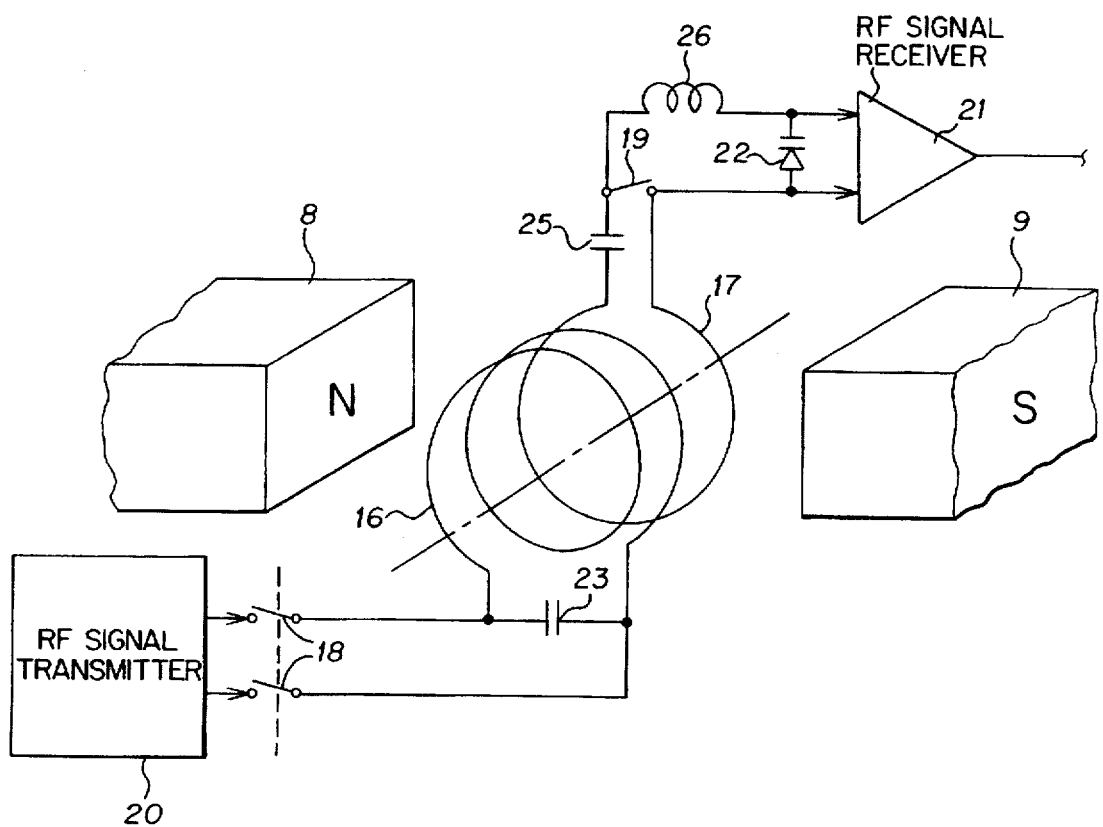
FIG. 4 is a schematic representation of the antenna system of FIG. 3.

The apparatus of the present invention, represented in FIGS. 3 and 4, comprises an antenna 15, which may be electronically tuned, needs low transmitter power, is small in size and is multi-orientable, has high sensitivity at reception and is inherently fail-safe. The magnets (shown in FIGS. 1 and 2) for producing a static magnetic field are not shown in FIG. 3 for ease of illustration.

The antenna 15 comprises at least two electromagnetically coupled circuits 27, 28. The inductance coil 16, 17 in each circuit 27, 28 produces an RF field enclosing the examination object (not shown, but see FIG. 1) sometimes somewhat inadequately. The electromagnetic interaction 24 between the circuits 27, 28 preferably produces a circuit resonating at the examination object's Larmor frequency. The circuits 27, 28 produce a combined RF field, which excites the nuclei of the full volume of interest and also intercepts the signal emitted by those nuclei as they relax from their higher energy state.

The spatial distribution of the RF field flux is defined by the shape of the inductance coils 16, 17 and by the distribution of currents in the coils.

The antenna 15 may have a number of oscillation modes: (i) if the level of electromagnetic interaction 24 (see FIG. 3) is substantially low but not equal to zero, there is only one resonant frequency and only one direction of current flow in coil 16 with respect to the current in coil 17; (ii) when level of electromagnetic interaction 24 is higher than a threshold value known as the "critical coupling level", two modes of oscillation are possible: one with current in coil 16 flowing in the same direction with respect to current in coil 17 and another with currents in coils 16 and 17 flowing oppositely. Each mode of oscillation corresponds to a different resonant frequency.

The condition (ii) above is prevalent. In general, the number of oscillation modes and so the number of resonant frequencies relates to the number of interacting coils N as $2^{N-1}+1$. In the case of two solenoid coils positioned along common axis, the lowest frequency of oscillation (the lowest resonant frequency) corresponds to the oscillation mode with currents flowing in the same direction in both coils, the highest resonant frequency occurs when currents in the coils flow in opposite directions, and the mid-range frequency is obtained when the electromagnetic interaction between the coils is below the "critical level". See U.S. Pat. No. 5,003,265, the entire contents of which are incorporated herein by reference, for a further discussion.

The first circuit 27 has a first variable capacitance 23, the variation in capacitance of which causes a shift in a resonant frequency of the first circuit 27, and also of the resonance frequency of the combined circuits 27, 28. The first capacitance 23 is connected in parallel to the first inductance coil 16. The circuit 27 comprising the first inductance coil 16 and first capacitance 23 is connected through a switch 18 to a source of RF transmitting power 20. The switch 18 is shown schematically as a mechanical switch in FIGS. 3 and 4 for ease of description, but is preferably implemented as an electronic switch, as described later. The switch 18 is in a closed position when the transmitter RF power is delivered to the antenna 15, allowing the power to excite the nuclei in the examination object. At other times the switch 18 is open, as shown in FIGS. 3 and 4.

The second circuit 28 is comprised of the second inductance coil 17 connected in series with a varactor 22 which serves as a variable capacitance, an auxiliary inductance 26 and a fixed second capacitance 25. The second capacitance 25 may be made variable, as desired. Varying the varactor capacitance 22 causes a shift in a resonant frequency of the combined circuit (comprising circuits 27 and 28). A receiver 21 picks up the signal emitted by the examination body (object, patient) by being connected to the second circuit 28 in parallel with the varactor 22. A switch 19 is coupled to short out the inductance coil 26, varactor 22 and receiver 21, and is operated synchronously with the switch 18. That is, both switches 18 and 19 are closed when transmitting RF power is delivered; and both switches 18 and 19 are open at other times (as shown in FIG. 3). The switch 19 is shown schematically in FIGS. 3 and 4 as a mechanical switch for ease of description, but is preferably implemented as an electronic switch, as described later.

When the switch 19 is closed, the second circuit 28 is transformed to effectively be comprised of two elements: the second inductance coil 17 and the second capacitance 25, and the resonant frequency of the transformed second circuit 28 in combination with the first circuit 27 is such that the resonant frequency of the antenna 15 preferably matches the frequency of the RF transmitting source 20, which is the examination object's Larmor frequency. The necessary tuning is provided by means of varying the first variable capacitance 23 or, if desired, by varying the capacitance of the second capacitance 25. The RF power from transmitter 20 is thus properly delivered into the examination object. At the same time, during RF power transmission, the shorting switch 19 (which is closed) prevents the power from reaching the varactor 22 and receiver 21, thus preventing a damaging level of signal from being fed to the varactor 22 and receiver 21, hence protecting them from destruction due to high power levels at transmission.

At reception, when both of the switches 18, 19 are open, the RF power source (transmitter) 20 is disconnected or decoupled from the antenna 15, the varactor capacitance 22 is a part of the second circuit 28 and is set to define the resonant frequency of the combined circuits 27, 28 to match the Larmor frequency of the relaxing nuclei. The signal from the second circuit 28 is fed to the RF signal receiver 21. The inductance of the auxiliary inductance coil 26 is chosen in such a way as to maintain the antenna's resonant frequency range through switching transformations of the second circuit 28. The second circuit 28 can also be used in a detuned mode during transmission, as long as the spatial positioning of the second inductance coil 17 and its interaction with the first circuit 27 is such that the RF transmitting field flux maintains its proper shape and coverage. As explained later (see FIGS. 5A–5D), omission of the auxiliary inductance 26 alone or together with the capacitance 25 is then possible, as well as other modifications of the second circuit 28.

The first and second inductance coils 16, 17 comprising the antenna 15 are positioned in close proximity to each other and, as such, they normally have a level of electromagnetic coupling or interaction between them which may be low (for example, only about a few percent) or which may be a higher level of interaction (for example, up to about 30% or even more). This low level of interaction leads to a frequency response curve of the combined circuits 27, 28 which approximates a multiplication of the frequency response curves of each member circuit 27, 28. The result is higher selectivity and sensitivity of the antenna 15 as compared to an antenna having only a single circuit. Varactor 22 provides accurate and speedy tuning of the antenna 15 at reception, which is essential for optimal extraction of the signal from background noise at varying load conditions.

Figure 3A:
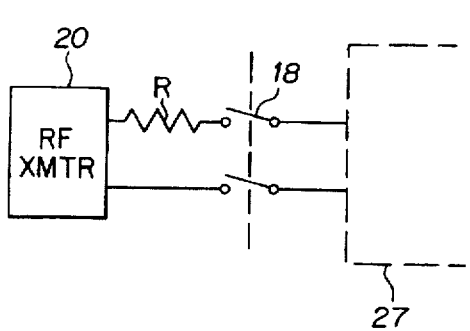
FIG. 3A is a partial schematic showing a modification of the embodiment of FIG. 3.

At transmission, the antenna 15 can be made substantially indifferent to load variations by coupling an ohmic resistance R (preferably less than 1 ohm) (see FIG. 3A) on the transmitter side of the first switch 18, which effectively widens the combined resonant circuits' andwidth. The not-shown parts of the system of FIG. 3A are the same as shown in FIG. 3. This approach of FIG. 3A, which widens the bandwidth, avoids the necessity of antenna tuning with replacement of examination objects (patients), at the expense of slightly higher transmitter RF power. The increase in RF power is negligible for most applications, as the initial RF power requirements are low because of the proximity of the antenna 15 to the examination object. At reception, the antenna 15 retains its high selectivity properties. The series resistor R of FIG. 3A could be placed in parallel with the output of RF transmitter 20, to achieve similar results. In this case, the resistance of the parallel resistor must be large.

The antenna 15 can be positioned at a multitude of orientations in an MRI or NMR apparatus as long as its electrical axis remains perpendicular to the static magnetic field orientation. It is, therefore, particularly suitable for kinematic orthopaedic examinations.

The antenna 15 of the present invention is fail-safe: unintended or excessive RF power delivery is avoided by automatic detuning of the antenna in the case of antenna component failure. Since the two circuits 27, 28 interact to produce a combined tuning effect, if one component fails, the whole system is detuned, and the delivered power drops, thus preventing damage to the object or patient under examination. The system also has low initial power requirements because the antennas are configured for the desired use, and lower power is thus used in many cases, thereby making the antenna system even more fail-safe.

Figure 3B:
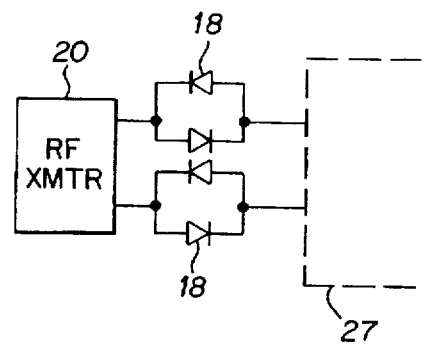
FIGS. 3B and 3C are partial schematic views showing diode switches replacing the switches shown schematically in FIG. 3.
Figure 3C:
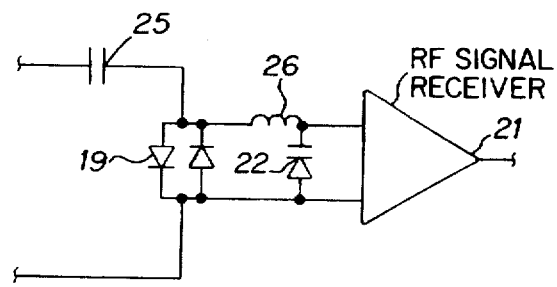
Figure 8:
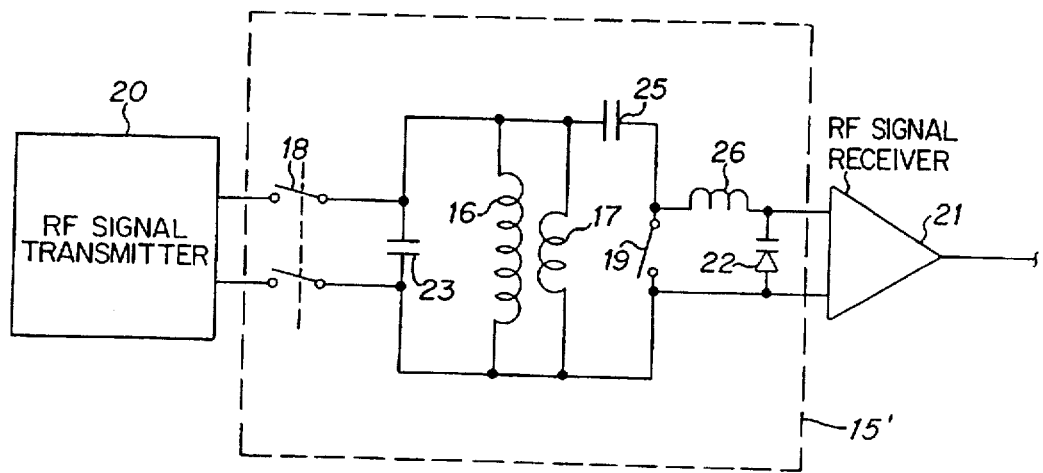
FIG. 8 shows a modified embodiment of the antenna system shown in FIG. 3.

FIG. 3B shows a simple implementation of the switches 18 as respective pairs of oppositely interconnected diodes, and FIG. 3C shows a simple implementation of the switch 19 as a pair of oppositely interconnected diodes. Such diode switches are shown, for example, in U.S. Pat. No. 4,975,644 (FIG. 8). Other electronic switching or electrically isolating arrangements could be used; see for example U.S. Pat. No. 5,144,244. In operation, the diode switching arrangement of FIGS. 3B and 3C is automatic. That is, when the transmitter is turned on to transmit an RF signal, the high power output of the transmitter, during the positive half cycle of the AC RF signal, causes the diode connected in the forward direction to conduct, and the diode connected in the reverse direction does not conduct. During the negative half cycle of the AC RF signal, the diode connected in the reverse direction conducts and the diode connected in the forward direction does not conduct. Each pair of diodes operates in a similar manner. When the transmitter 20 is turned off, the stray signals in the system are not sufficient to cause the diodes to conduct, even in their respective forward directions, thereby effectively isolating the transmitter 20 from the antenna 15 during times when the transmitter 20 is turned off. Similarly, at the receiver side, when the transmitter 20 is turned on, the RF signals passing through the diodes 19 in FIG. 3C are sufficiently large to cause the diodes to conduct in their respective forward directions (during the positive and negative half cycles, respectively) to effectively short out the input of the receiver 21. When the transmitter 20 is turned off, the signals flowing through the circuit are sufficiently low that the diodes 19 are not turned on, even in their forward directions, thereby appearing as an essentially open circuit and permitting the received signals to be forwarded to the RF signal receiver 21.

If higher threshold switching voltages are required, two or more series connected diodes can be used in place of each diode shown in FIGS. 3B and 3C, for example as shown in FIG. 8 of U.S. Pat. No. 4,975,644. The diode switching systems described above do not provide the strict open-close electrical conditions of a mechanical switching arrangement 18, 19 discussed above, but provide (i) a low enough impedance in their conducting states so as to be substantially similar to a closed mechanical switch, and (ii) a high enough impedance in their non-conducting states so as to be substantially similar to an open mechanical switch to essentially open a signal path or decouple or isolate elements from each other, at least in the systems of the present invention. The term "short out" as used in this specification and in the claims means to short out with a mechanical switch or to effectively short out with an electrical switch (such as with forward conducting diodes which have a low forward impedance). The term "electrically open" as used herein means to open a mechanical switch or to effectively open an electrical switch (such as one or more diodes or semiconductors operating in a reverse biassed or other "open" condition so as to present a high enough impedance so as to be considered to be an electrically open or electrically isolating condition).

Those skilled in the art will recognize that the potential implementations of the antenna of the present invention are numerous and application driven. The Larmor frequency, the nature of the examination object and magnetic field orientation will prescribe the specified antenna's shape, size and components. It will also be clear that a multitude of components can be used instead of those specifically described. For example, as mentioned above, a pair of parallel and oppositely interconnected diodes (or other electronic switching arrangements) can be used in place of each switching pole 18, 19, a set of capacitors including stray capacitance can be used in place of any single capacitor, any type and number of variable capacitors can be used in place of varactor 22 and other inductance connections and/or configuration can be used. Also, standard consideration should be given to stray reactances and to impedance matching of the transmitter 20 and receiver 21. Tuning of the system can be by one or more of changing or varying capacitances in the circuits, changing or varying inductances in the circuits, changing or varying the level of electromagnetic coupling between the circuits, and adding and/or removing circuit elements.

In the illustrated embodiments, the impedance matching circuitry is presumed to be integral parts of the RF signal transmitter 20, and RF signal receiver 21, respectively.

Figure 9:
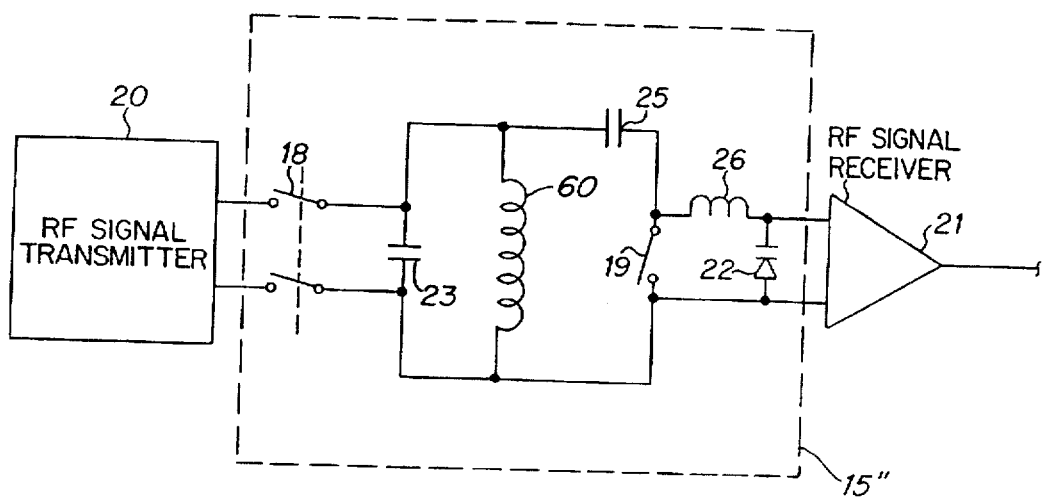
FIG. 9 shows the electrical equivalent of the modified embodiment of FIG. 8.

The circuit 15 of FIG. 3 could be configured differently as shown by the circuit 15' in FIG. 8. The arrangement of FIG. 8 is the same as FIG. 3, except that the coils 16, 17 are galvanically connected together, as shown in FIG. 8, so as to "electromagnetically" appear as a single coil. FIG. 9 shows the electrical equivalent of the arrangement of FIG. 8, wherein the galvanically connected coils 16 and 17, which are galvanically connected in parallel, are shown by a single equivalent coil 60 in the circuit 15". In practical implementation, the coil 60 can take the form of at least two electrically connected coils (electrically connected as shown in FIG. 8) or can be a single coil, as depicted in FIG. 9. In other respects, the circuits of FIGS. 8 and 9 operate similar to the circuit of FIG. 3, and the switching arrangements 18, 19 operate also in a similar manner to produce the same results as provided with the arrangement of FIG. 3 and the other systems shown herein (with the exception of the configuration depicted in FIG. 5B which is not applicable).

Figure 5A:
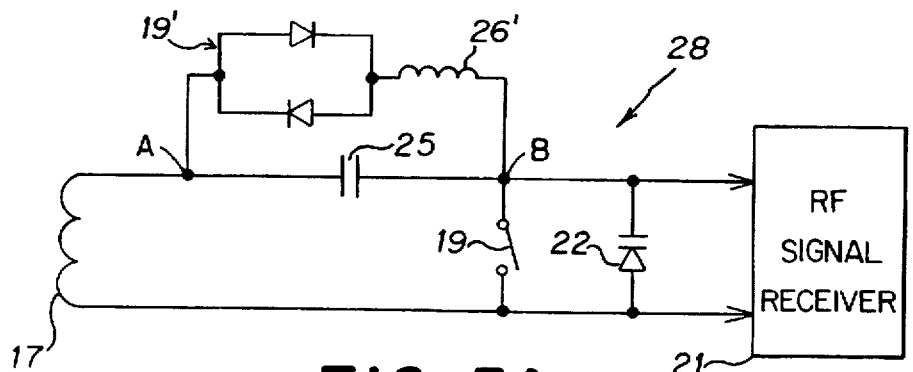
FIGS. 5A–5D show modified receiver-side configurations of the antenna system of the present invention.
Figure 5B:
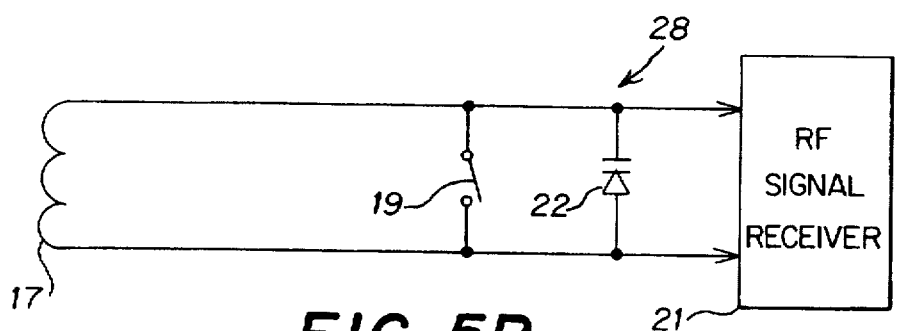
Figure 5C:
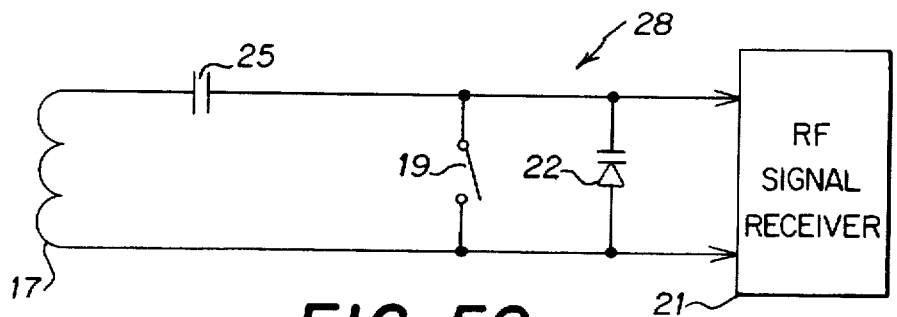
Figure 5D:
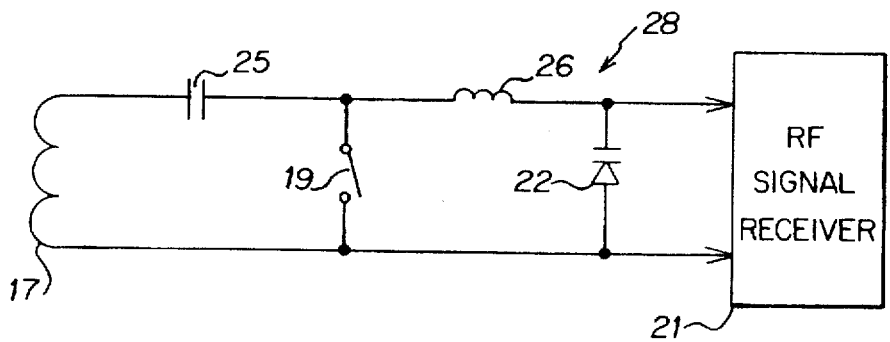

The circuit 28 could be configured differently, for example, as shown in FIGS. 5A–5D. The fundamental difference between the configurations of FIGS. 5A–5D is the behavior during transmission when switch 19 is closed. The configurations of FIGS. 5A and 5D are tunable, while the configurations of FIGS. 5B and 5C are detuned. During reception, all configurations shown behave similarly, in a way described before. Only receiver side circuits are shown in FIGS. 5A–5D. The transmission side is as shown in FIGS. 3 and/or 4 (and/or as modified by FIGS. 3A or 3B).

The proper shape and coverage of the RF field flux depends on the shape of the coils and on the current distribution within them. The current flowing in coil 17 and its electromagnetic interaction with coil 16 can be modified by using different circuit configurations such as depicted in FIGS. 5A–5D.

Coil 17 in the configuration of FIG. 5B during transmission acts as a conductive shield; the same in FIG. 5C, the difference being a phase shift induced in the coil's current by capacitor 25 and which depends on the value of the capacitor 25. In FIG. 5A, the diodes 19' act as a switch being activated by the high transmission power and connecting inductance 26' with capacitor 25 in a parallel resonant circuit configuration which, when properly tuned, has a substantially high impedance between nodes A and B during transmission. This reduces the current in coil 17 and significantly diminishes the effect the coil 17 is having on the combined RF field flux at the time of transmission. During reception, diodes 19' are open and the inductance 26' does not affect the circuit. The configuration of FIG. 5D was discussed hereinabove.

The circuit 28 in FIGS. 5A–5B has a substantially different effect on the RF field flux (of antenna 15) which is produced during transmission versus during reception. The circuit 28 in the configuration of FIG. 5D, on the other hand, contributes to the combined RF field flux during transmission and reception in a substantially similar way.

Figure 6:
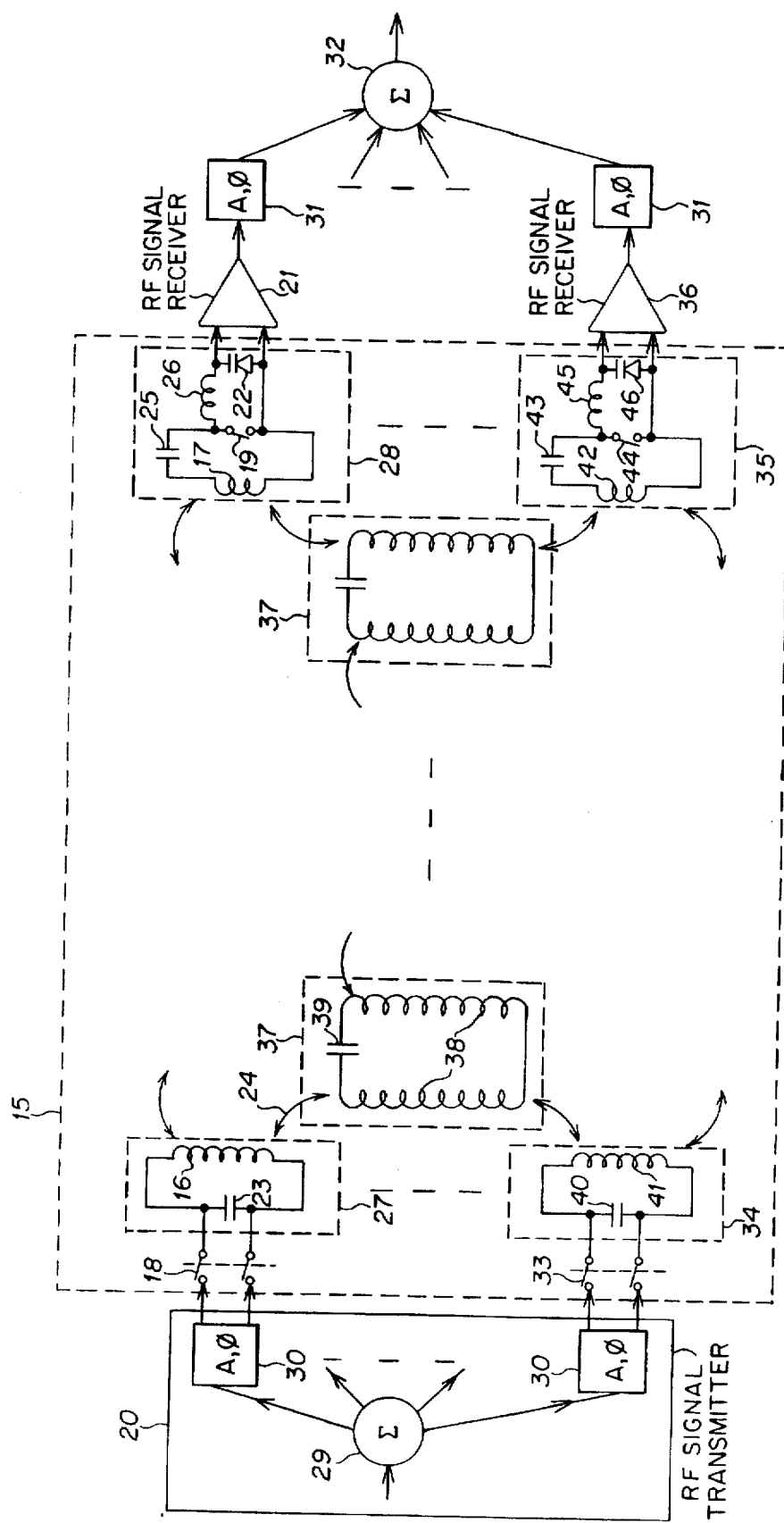
FIG. 6 shows a generalization of the embodiment of FIG. 3, arranged in an antenna array configuration.

FIG. 6 shows a generalization of the embodiment shown in FIG. 3. Antenna 15 in FIG. 6 is arranged in a coil array configuration and is conceptually similar to radar array antennas (also known as phase array antennas) in which simultaneous radiation by many antenna elements is combined to produce an electromagnetic field of a desired shape and direction. The radiation by each element is controlled in amplitude and phase (sometimes in phase only), and passive elements (reflectors) are employed to help in shaping the electromagnetic field. The shape of the electromagnetic field can be controlled separately at reception and transmission.

The antenna 15 employs a plurality of circuits 27 (34), each of which is fed through a switch circuit 18 (33) from an RF signal transmitter 20 supplying a signal of an appropriate amplitude and phase to each circuit 27, 34. Schematically, the supplied signal is shown as a signal split by splitter 29 and then passing through respective amplitude and phase modifiers 30. The circuits 30 may each include a phase shifter and an amplitude adjuster or a circuit known as a "vector modulator". Another plurality of circuits 28 (35) is connected each to separate RF signal receivers 21 (36), the outputs of which are weighted (modified in amplitude and phase) by circuits 31 and combined together at combiner 32. The circuits 31 may be similar to circuits 30, and combiner circuit 32 may be similar to splitter 29 but operating in reverse. The circuits 28 (35) also employ respective switches 19 (44) and are tunable by means of respective varactors 22 (46). For a full description of the circuits 27 (34) and 28 (35), see the prior discussion of FIG. 3. Only two circuits 27, 34 are shown, but more may be provided as indicated by the dashed line between circuits 27 and 34. Similarly, more circuits 28, 35 can be provided as indicated by the dashed line between circuits 28 and 35. The coils 16 (41) and 17 (42) and coils 38 of reflector circuits 37 are electromagnetically coupled among themselves. The reflector circuit 37 generally employs an inductance coil 38 and a capacitor 39 of an appropriate value. A plurality of electromagnetically coupled reflector circuits 37 are provided, as shown in FIG. 6. All switches operate in synchronism. During transmission, switches 18 (33) and 19 (44) are effectively closed, and during reception they are effectively open. The number of circuits and their distribution among different types is not principally limited and is defined by practical considerations. The coil antenna array offers a number of advantages among which is the flexibility of shaping the RF field's coverage at reception as well as at transmission, large field-of-view, high signal-to-noise ratio, reduction of artifacts, and multi-frequency capability.

One specific implementation of an antenna array in its simplest form is shown in FIG. 3 and has been described herein.

Another specific implementation of a coil antenna array is the antenna as shown in FIG. 6, but employing only one circuit 27 and one circuit 28 (i.e., circuits 34 and 35 are not provided) and a plurality of reflector circuits 37. The properties of such an antenna are described in U.S. Pat. No. 5,003,265.

Figure 7:
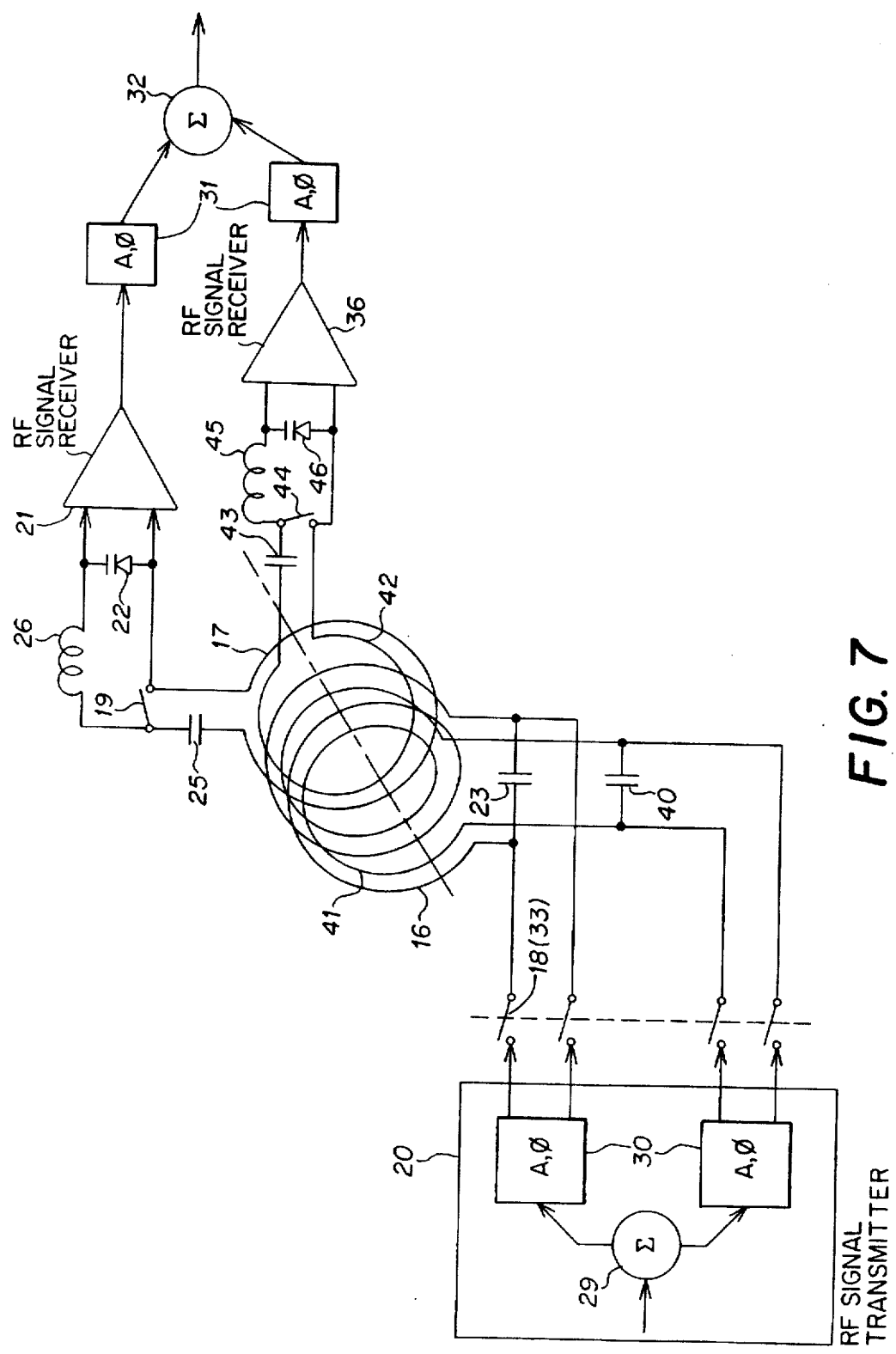
FIG. 7 shows an example of an antenna array with "self-shielding" properties.

Still another specific embodiment is shown in FIG. 7. The embodiment of FIG. 7 has two sets of solenoid coils, the second set of coils 41, 42 being positioned concentrically within the first set 16, 17. Coils 16 and 41 are fed through switches 18 (33) from an RF signal transmitter 20 with signals of appropriate amplitude and phase (shown schematically as passing through a splitter 29 and signal modifiers 30). Coils 17 and 42 are each part of a circuit conductively connected to RF signal receivers 21 and 36, respectively. The outputs from the receivers 21 and 36 are combined together at combiner 32 after applying appropriate weighting by signal modifying circuits 31. The elements which are not mentioned here were described before with reference to FIGS. 3 and 6. With properly adjusted amplitude and phase of signals, an RF field flux similar to that of a "self-shielded coil" can be achieved. A self-shielded solenoid coil ideally has a very low fringe field radiated radially outward, which contributes to the elimination of interaction of the coil with the environment on the outside of the coil and, therefore, substantially improves the ability of the coil to pick up a signal from the examination object positioned within the coil.

It will be appreciated that the instant specification is set forth by way of illustration and not limitation, and that various modifications and changes may be made without departing from the spirit and scope of the present invention.

I claim:

1. An antenna system for use in a nuclear magnetic resonance or magnetic resonance imaging apparatus which includes a radio frequency (RF) signal transmitter and a radio frequency (RF) signal receiver, the antenna system comprising:

at least first and second electromagnetically coupled circuits;

said first circuit comprising a first inductance producing a first electromagnetic field flux vector;

said second circuit comprising a second inductance producing a second electromagnetic field flux vector;

said first and second inductances being electromagnetically coupled such that the first electromagnetic field flux vector has a component interacting with a component of the second electromagnetic field flux vector; and a switch system coupled to said first circuit and to said second circuit, said switch system having:

a first switching position for coupling said first circuit to an output of said RF signal transmitter and for preventing a damaging level of signal from said second circuit from being fed to an input of said RF signal receiver, and a second switching position for permitting an RF signal from said second circuit to be fed to an input of said RF signal receiver and for decoupling said first circuit from the output of said RF signal transmitter;

and wherein:

said antenna system produces an electromagnetic field flux enclosing an examination object therewithin, which electromagnetic field flux is used to irradiate the examination object, when said switch system is in the first switching position; and an electromagnetic field flux produced by a signal emitted by the examination object's relaxing nuclei is picked up by said electromagnetically coupled inductances and is fed to said RF signal receiver via said second circuit, when said switch system is in the second switching position.

2. The antenna system of claim 1, wherein:

said first circuit comprises at least a first capacitance connected in parallel with said first inductance, and comprising together with said first inductance the first circuit, and wherein at least said first capacitance is used for frequency tuning of the antenna system at least during transmission; and said switch system includes at least one first switching element coupling said first circuit to said RF signal transmitter output in said first switching position and decoupling said first circuit from said RF signal transmitter output in said second switching position.

3. The antenna system of claim 2, wherein said first capacitance comprises a variable capacitor element.

4. The antenna system of claim 2, wherein:
said second circuit comprises:
a variable capacitance element, coupled for frequency tuning of the antenna circuitry;
a second capacitance; and
an auxiliary inductance for roughly matching an impedance of said second capacitance;
said second capacitance, said variable capacitance element and said auxiliary inductance being coupled together and being further coupled to said second inductance; and
said switch system includes a second switching element coupled to selectively short out at least said variable capacitance element and said RF receiver input, and for electrically removing at least said variable capacitance element and said RF receiver input from said second circuit, in said first switching position, and said second switching element being electrically open and having substantially no electrical effect in said second switching position.

5. The antenna circuitry of claim 4, wherein said variable capacitance element comprises at least one varactor.

6. The antenna system of claim 4, wherein said first capacitance comprises a variable capacitor element.

7. The antenna system of claim 1, wherein:
said second circuit comprises:
a variable capacitance element, coupled for frequency tuning of the antenna circuitry;
a second capacitance; and
an auxiliary inductance for roughly matching an impedance of said second capacitance;
said second capacitance, said variable capacitance element and said auxiliary inductance being coupled together and being further coupled to said second inductance; and
said switch system includes a second switching element coupled to selectively short out at least said variable capacitance element and said RF receiver input, and for electrically removing at least said variable capacitance element and said RF receiver input from said second circuit, in said first switching position, and said second switching element being electrically open and having substantially no electrical effect in said second switching position.

8. The antenna circuitry of claim 7, wherein said variable capacitance element comprises at least one varactor.

9. The antenna system of claim 7, wherein said first circuit comprises a capacitor element connected to said first inductance.

10. The antenna system of claim 7, wherein said second capacitance, said variable capacitance element and said auxiliary inductance are connected in a series connection.

11. The antenna system of claim 10, wherein said series connection is serially connected with said second inductance.

12. The antenna system of claim 7, wherein said auxiliary inductance is connected in series with a switch device, the series connection being connected in parallel with said second capacitance.

13. The antenna system of claim 1, wherein said switch system comprises:
at least a first pair of opposite polarity, parallel connected, diodes coupled to an output of said RF signal transmitter; and
at least a second pair of opposite polarity, parallel connected, diodes coupled across an input of said RF signal receiver.

14. The antenna system of claim 1, further comprising a resistance coupled to an output of said RF signal transmitter.

15. The antenna system of claim 1, wherein:
said second circuit comprises:
a variable capacitance element, coupled for frequency tuning of the antenna circuitry;
a second capacitance; and
said second capacitance and said variable capacitance element being connected to said second inductance; and
said switch system includes a second switching element coupled to selectively short out at least said variable capacitance element and said RF receiver input, and for electrically removing at least said variable capacitance element and said RF receiver input from said second circuit, in said first switching position, and said second switching element being electrically open and having substantially no electrical effect in said second switching position.

16. The antenna circuitry of claim 15, wherein said variable capacitance element comprises a varactor.

17. The antenna system of claim 15, wherein said first circuit comprises a capacitor element connected to said first inductance.

18. The antenna system of claim 1, wherein:
said second circuit comprises:
a variable capacitance element, coupled for frequency tuning of the antenna circuitry;
said variable capacitance element being coupled to said second inductance; and
said switch system includes a second switching element coupled to selectively short out at least said variable capacitance element and said RF receiver input, and for electrically removing said variable capacitance element and said RF receiver input from said second circuit, in said first switching position, and said second switching element being electrically open and having substantially no electrical effect in said second switching position.

19. The antenna circuitry of claim 18, wherein said variable capacitance element comprises a varactor.

20. The antenna system of claim 18, wherein said first circuit comprises a capacitor element connected to said first inductance.

21. A method of operating an antenna system in a nuclear magnetic resonance or magnetic resonance imaging apparatus which includes a radio frequency (RF) signal transmitter and a radio frequency (RF) signal receiver, the method comprising:
providing at least first and second electromagnetically coupled circuits;
said first circuit comprising a first inductance producing a first electromagnetic field flux vector;
said second circuit comprising a second inductance producing a second electromagnetic field flux vector;
causing said first and second inductances to be electromagnetically coupled such that the first electromagnetic field flux vector has a component interacting with a component of the second electromagnetic field flux vector; and
switching said first circuit and said second circuit with a switch system such that:
when said switch system is in a first switching position, said first circuit is coupled to an output of said RF signal transmitter, and a damaging level of signal from said second circuit is prevented from being fed to an input of said RF signal receiver, and when said switch system is in a second switching position, an RF signal from said second circuit is fed to an input of said RF signal receiver and said first circuit is decoupled from an output of said RF signal transmitter; and wherein:

said antenna system produces an electromagnetic field flux enclosing an examination object therewithin, which electromagnetic field flux is used to irradiate the examination object, when said switch system is in the first switching position; and an electromagnetic field flux produced by a signal emitted by the examination object's relaxing nuclei is picked up by said electromagnetically coupled inductances and is fed to said RF signal receiver via said second circuit, when said switch system is in the second switching position.

22. The method of claim 21, wherein:

the frequency response and the electromagnetic field flux of said antenna system is set independently and separately in the first and second switching positions.

23. The method of claim 21, wherein the antenna system is positioned at any angle orthogonal to a static magnetic field of the apparatus.

24. The method of claim 21, comprising maintaining said antenna system tuned to the object's Larmor frequency when said switch system is in said first switching position.

25. The method of claim 21, comprising detuning said second circuit from the object's Larmor frequency when said switch system is in said first switching position.

26. The method of claim 21, wherein said antenna system is tuned to the object's Larmor frequency when said switch system is in said second switching position.

27. The antenna system of claim 1, wherein:

at least one of the first and second circuits is electromagnetically coupled to at least one third circuit which includes at least a third inductance;

said third inductance being electromagnetically coupled at least to adjacent inductance so as to contribute to an electromagnetic field flux enclosing the examination object.

28. The antenna system of claim 27, comprising a plurality of said third circuits electromagnetically coupled to at least some of said first and second circuits and each other.

29. The antenna system of claim 1, comprising:

a plurality of first circuits, each first circuit including an inductance, each first circuit being coupled to said signal transmitter through said switch system;

and wherein said first circuits are electromagnetically coupled to said second circuit.

30. The antenna system of claim 29, wherein said first circuits are electromagnetically coupled together.

31. The antenna system of claim 29, comprising:

a plurality of second circuits, each second circuit including an inductance, each second circuit being coupled to said receiver through said switch system;

and wherein said second circuits are electromagnetically coupled to said first circuits.

32. The antenna system of claim 31, wherein said second circuits are electromagnetically coupled together.

33. The antenna system of claim 32, wherein said first circuits are electromagnetically coupled together.

34. The antenna system of claim 1, comprising:

a plurality of second circuits, each second circuit including an inductance, each second circuit being coupled to said receiver through said switch system;

and wherein said second circuits are electromagnetically coupled to said first circuit.

35. The antenna system of claim 34, wherein said second circuits are electromagnetically coupled together.

36. The antenna system of claim 29, wherein:

at least one of the plurality of first circuits is electromagnetically coupled to said second circuit with at least one third circuit, the at least one third circuit including at least a third inductance;

said third inductance being electromagnetically coupled at least to adjacent inductances so as to contribute to an electromagnetic field flux enclosing the examination object.

37. The antenna system of claim 36, wherein said first circuits are electromagnetically coupled together.

38. The antenna system of claim 31, wherein:

the plurality of first circuits are electromagnetically coupled to said plurality of second circuits with at least one third circuit, the at least one third circuit including at least a third inductance;

said third inductance being electromagnetically coupled at least to adjacent inductances so as to contribute to an electromagnetic field flux enclosing the examination object.

39. The antenna system of claim 38, wherein said first circuits are electromagnetically coupled together.

40. The antenna system of claim 39, wherein said second circuits are electromagnetically coupled together.

41. The antenna system of claim 38, wherein said second circuits are electromagnetically coupled together.

42. The antenna system of claim 34, wherein:

at least one of the plurality of second circuits is electromagnetically coupled to said first circuit with at least one third circuit, the at least one third circuit including at least a third inductance;

said third inductance being electromagnetically coupled at least to adjacent inductances so as to contribute to an electromagnetic field flux enclosing the examination object.

43. The antenna system of claim 42, wherein said second circuits are electromagnetically coupled together.

44. The method of claim 21, comprising:

providing at least one third circuit which includes at least a third inductance;

at least one of said first and second circuits being electromagnetically coupled to said at least one third circuit; and said at least one third circuit being electromagnetically coupled at least to adjacent inductances so as to contribute to an electromagnetic field flux enclosing the examination object.

45. The method of claim 21, comprising:

providing a plurality of said third circuits electromagnetically coupled to said at least some of said first and second circuits and to each other.

46. The method of claim 21, comprising:

providing a plurality of first circuits, each first circuit including an inductance, and each first circuit being coupled to said signal transmitter through said switch system;

and wherein said first circuits are electromagnetically coupled to said second circuit.

47. The method of claim 46, wherein said first circuits are electromagnetically coupled together.

48. The method of claim 46, comprising:

providing a plurality of second circuits, each second circuit including an inductance, and each second circuit being coupled to said receiver through said switch system;

and wherein said second circuits are electromagnetically coupled to said first circuits.

49. The method of claim 48, wherein said second circuits are electromagnetically coupled together.

50. The method of claim 49, wherein said first circuits are electromagnetically coupled together.

51. The method of claim 21, comprising:

providing a plurality of second circuits, each second circuit including an inductance, and each second circuit being coupled to said receiver through said switch system;

and wherein said second circuits are electromagnetically coupled to said first circuit.

52. The method of claim 51, wherein said second circuits are electromagnetically coupled together.

53. The method of claim 46, comprising:

electromagnetically coupling at least one of the plurality of first circuits to said second circuit with at least one third circuit, the at least one third circuit including at least a third inductance;

said third inductance being electromagnetically coupled at least to adjacent inductances so as to contribute to an electromagnetic field flux enclosing the examination object.

54. The method of claim 53, wherein said first circuits are electromagnetically coupled together.

55. The method of claim 48, comprising:

electromagnetically coupling at least one of the plurality of first circuits to plurality of said second circuits with at least one third circuit, the at least one third circuit including at least a third inductance;

said third inductance being electromagnetically coupled at least to adjacent inductance so as to contribute to an electromagnetic field flux enclosing the examination object.

56. The method of claim 55, wherein said first circuits are electromagnetically coupled together.

57. The method of claim 56, wherein said second circuits aeelectromagnetically coupled together.

58. The method of claim 55, wherein said second circuits are electromagnetically coupled together.

59. The method of claim 51, comprising:

electromagnetically coupling at least one of the plurality of second circuits to said first circuit with at least one third circuit, the at least one third circuit including at least a third inductance;

said third inductance being electromagnetically coupled at least to adjacent inductances so as to contribute to an electromagnetic field flux enclosing the examination object.

60. The method of claim 59, wherein said second circuits are electromagnetically coupled together.

61. An antenna system for use in a nuclear magnetic resonance or magnetic resonance imaging apparatus which includes a radio frequency (RF) signal transmitter and a radio frequency (RF) signal receiver, the antenna system comprising:

at least one circuit, including an inductance, for producing an electromagnetic field flux vector; and a switch system coupled to said at least one circuit, said switch system having:

a first switching position for coupling said at least one circuit to an output of said RF signal transmitter and for preventing a damaging level of signal from said at least one circuit from being fed to an input of said RF signal receiver, and a second switching position for permitting an RF signal from said at least one circuit to be fed to an input of said RF signal receiver and for decoupling said at least one circuit from the output of said RF signal transmitter;

and wherein:

said antenna system produces an electromagnetic field flux enclosing an examination object therewithin, which electromagnetic field flux is used to irradiate the examination object, when said switch system is in the first switching position; and an electromagnetic field flux produced by a signal emitted by the examination object's relaxing nuclei is picked up by said at least one circuit and is fed to said RF signal receiver, when said switch system is in the second switching position.

62. The antenna system of claim 61, wherein:

said at least one circuit comprises at least a first capacitance connected in parallel with said inductance, and wherein at least said first capacitance is used for frequency tuning of the antenna system at least during transmission; and said switch system includes at least one first switching element coupling said at least one circuit to said RF signal transmitter output in said first switching position and decoupling said at least one circuit from said RF signal transmitter output in said second switching position.

63. The antenna system of claim 62, wherein said first capacitance comprises a variable capacitor element.

64. The antenna system of claim 62, wherein:

said at least one circuit further comprises a second capacitance, said second capacitance comprising a variable capacitance element coupled to said inductance for frequency tuning at least during reception when said switch system is in the second switching position; and said switch system includes a second switching element coupled to selectively effectively short out at least said variable capacitance element and said RF receiver input, and for thereby electrically removing at least said variable capacitance element and said RF receiver input from said at least one circuit when said switch system is in the first switching position, and said second switching element being electrically open and having substantially no electrical effect when said switch system is in said second switching position.

65. A method of operating an antenna system in a nuclear magnetic resonance or magnetic resonance imaging apparatus which includes a radio frequency (RF) signal transmitter and a radio frequency (RF) signal receiver, the method comprising:

providing at least one circuit including an inductance, for producing an electromagnetic field flux vector; and switching said at least one circuit with a switch system such that:

when said switch system is in a first switching position, said at least one circuit is coupled to an output of said RF signal transmitter, and a damaging level of signal from said at least one circuit is prevented from being fed to an input of said RF signal receiver, and when said switch system is in a second switching position, an RF signal from said at least one circuit is fed to an input of said RF signal receiver and said at least one circuit is decoupled from an output of said RF signal transmitter;

and wherein:

said antenna system produces an electromagnetic field flux enclosing an examination object therewithin, which electromagnetic field flux is used to irradiate the examination object, when said switch system is in the first switching position; and an electromagnetic field flux produced by a signal emitted by the examination object's relaxing nuclei is picked up by said at least one circuit and is fed to said RF signal receiver when said switch system is in the second switching position.

66. The method of claim 65, comprising frequency tuning the antenna system with a capacitance coupled to said inductance.

67. The method of claim 66, wherein said capacitance comprises a variable capacitance for frequency tuning the antenna system.

68. The method of claim 66, comprising maintaining said antenna system tuned to the object's Larmor frequency when said switch system is in said first switching position.

69. The method of claim 66, wherein said antenna system is tuned to the object's Larmor frequency when said switch system is in said second switching position.

* * * * *